(12) United States Patent
Hargreaves

(10) Patent No.: US 9,703,436 B2
(45) Date of Patent: Jul. 11, 2017

(54) HYBRID LARGE DYNAMIC RANGE CAPACITANCE SENSING

(71) Applicant: SYNAPTICS INCORPORATED, San Jose, CA (US)

(72) Inventor: Kirk Hargreaves, Mountain View, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 55 days.

(21) Appl. No.: 14/726,081

(22) Filed: May 29, 2015

(65) Prior Publication Data

US 2016/0349872 A1    Dec. 1, 2016

(51) Int. Cl.
*G06F 3/044* (2006.01)
*H03K 17/96* (2006.01)
*G06F 3/041* (2006.01)

(52) U.S. Cl.
CPC ............ *G06F 3/044* (2013.01); *G06F 3/0418* (2013.01); *H03K 17/9622* (2013.01); *H03K 2217/960705* (2013.01); *H03K 2217/960775* (2013.01)

(58) Field of Classification Search
None
See application file for complete search history.

(56) References Cited

U.S. PATENT DOCUMENTS

| 6,222,528 | B1* | 4/2001 | Gerpheide | G06F 3/044 345/173 |
| 8,836,669 | B1* | 9/2014 | Ogirko | G06F 3/044 178/18.06 |
| 8,913,021 | B2 | 12/2014 | Elias et al. | |
| 2010/0245289 | A1* | 9/2010 | Svajda | G06F 3/0421 345/175 |
| 2010/0328262 | A1 | 12/2010 | Huang et al. | |
| 2012/0162088 | A1 | 6/2012 | van Lieshout et al. | |
| 2012/0169659 | A1 | 7/2012 | Welland | |
| 2013/0169340 | A1* | 7/2013 | Tao | G06F 3/0416 327/336 |
| 2013/0285971 | A1 | 10/2013 | Elias et al. | |
| 2014/0132287 | A1 | 5/2014 | Reynolds et al. | |
| 2015/0212643 | A1* | 7/2015 | Lee | G06F 3/044 345/174 |
| 2015/0242050 | A1* | 8/2015 | Huang | G06F 3/044 345/174 |

* cited by examiner

*Primary Examiner* — David D Davis
(74) *Attorney, Agent, or Firm* — Patterson + Sheridan, LLP

(57) ABSTRACT

A processing system that includes a charge integrator, a compensation unit, and a fine signal processing unit. The compensation unit detects when the output of the charge integrator is outside of a certain range related to the dynamic range of the charge integrator and adds or subtract charge from an input of the charge integrator in response. The compensation unit records a count of the number of times that charge is added or subtracted and produces a coarse sensing result from this count. The fine signal processing unit processes the output of the charge integrator after charge is added or removed. The compensation unit processes the coarse sensing result and adds the processed value to fine sensing result from the fine signal processing unit to obtain a final output value. This final output value is the same value as if a charge integrator with a larger dynamic range were used.

20 Claims, 9 Drawing Sheets

HYBRID LARGE DYNAMIC RANGE CAPACITANCE SENSING

BACKGROUND

Field of the Disclosure

Embodiments generally relate to input sensing and, in particular, to a technique for hybrid large dynamic range capacitance sensing.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location, and/or motion of one or more input objects. Proximity sensor devices may be used to provide interfaces for the electronic system. For example, proximity sensor devices are often used as input devices for larger computing systems (such as opaque touchpads integrated in, or peripheral to notebook or desktop computers). Proximity sensor devices are also often used in smaller computing systems (such as touch screens integrated in cellular phones).

Input devices include processing circuitry that may include a charge integrator and other processing components. The charge integrator integrates a change in charge presented to an input of the charge integrator that happens as a result of driving a sensor electrode with a signal for capacitive sensing. The charge integrator has a dynamic range, which indicates the range of charge change that can be accommodated by the charge integrator. Outside of this range, the output of the charge integrator does not vary linearly with the change of charge input to the charge integrator.

The dynamic range of a charge integrator can be increased by increasing the size of a feedback capacitor of the charge integrator. However, in integrated circuits, the amount of area consumed by a capacitor is dependent on the capacitance value of the capacitor. Thus, if there is a desire to reduce the size of an integrated circuit that is used for processing sensing signals related to capacitive sensing, then a solution other than simply increasing the size of a capacitor is needed.

SUMMARY

A processing system for processing a signal received from a capacitive touch sensor driven with a sensing signal is provided. The processing unit includes a charge integrator coupled to the capacitive touch sensor at a first node. The processing unit also includes a fine signal processing unit configured to perform signal processing on an output of the charge integrator to generate a fine logic output. The processing unit further includes a compensation unit. The compensation unit is configured to subtract charge from or add charge to the first node in discrete amounts of charge during a sensing half period of the sensing signal. The compensation unit is also configured to perform signal processing on a coarse sensing result that is based on the charge that is added to or subtracted from the first node during the sensing half period to generate a coarse logic output. The compensation unit is further configured to add the coarse logic output to the fine logic output to generate a processed signal output.

A method for processing a signal received from a capacitive touch sensor driven with a sensing signal is provided. The method includes integrating charge, via a charge integrator, at a first node coupled to the capacitive touch sensor. The method also includes performing signal processing on an output of the charge integrator to generate a fine logic output. The method further includes subtracting charge from or adding charge to the first node in discrete amounts of charge during a sensing half period of the sensing signal. The method also includes performing signal processing on a coarse sensing result that is based on the charge that is added to or subtracted from the first node during the sensing half period to generate a coarse logic output. The method further includes adding the coarse logic output to the fine logic output to generate a processed signal output.

An input device is provided. The input device includes a capacitive touch sensor and a processing unit coupled to the capacitive touch sensor. The processing unit includes a charge integrator coupled to the capacitive touch sensor at a first node. The processing unit also includes a fine signal processing unit configured to perform signal processing on an output of the charge integrator to generate a fine logic output. The processing unit further includes a compensation unit. The compensation unit is configured to subtract charge from or add charge to the first node in discrete amounts of charge during a sensing half period of the sensing signal. The compensation unit is also configured to perform signal processing on a coarse sensing result that is based on the charge that is added to or subtracted from the first node during the sensing half period to generate a coarse logic output. The compensation unit is further configured to add the coarse logic output to the fine logic output to generate a processed signal output.

BRIEF DESCRIPTION OF THE DRAWINGS

So that the manner in which the above recited features of embodiments can be understood in detail, a more particular description of embodiments, briefly summarized above, may be had by reference to embodiments, some of which are illustrated in the appended drawings. It is to be noted, however, that the appended drawings illustrate only typical embodiments and are therefore not to be considered limiting of scope, for other effective embodiments may be admitted.

To facilitate understanding, identical reference numerals have been used, where possible, to designate identical elements that are common to the figures. It is contemplated that elements of one embodiment may be beneficially incorporated in other embodiments.

DETAILED DESCRIPTION

The following detailed description is merely exemplary in nature and is not intended to limit the embodiments or the application and uses of such embodiments. Furthermore, there is no intention to be bound by any expressed or implied theory presented in the preceding technical field, background, brief summary or the following detailed description.

Various embodiments provide a processing system that includes a charge integrator, a compensation unit, and a fine signal processing unit. The compensation unit detects when the output of the charge integrator is outside of a certain range related to the dynamic range of the charge integrator and adds or subtract charge from an input of the charge integrator in response. The compensation unit records a count of the number of times that charge is added or subtracted and produces a coarse sensing result from this count. The fine signal processing unit processes the output of the charge integrator after charge is added or removed. The compensation unit processes the coarse sensing result and adds the processed value to fine sensing result from the fine signal processing unit to obtain a final output value. This final output value is the same value as if a charge integrator with a larger dynamic range were used.

Figure 1:
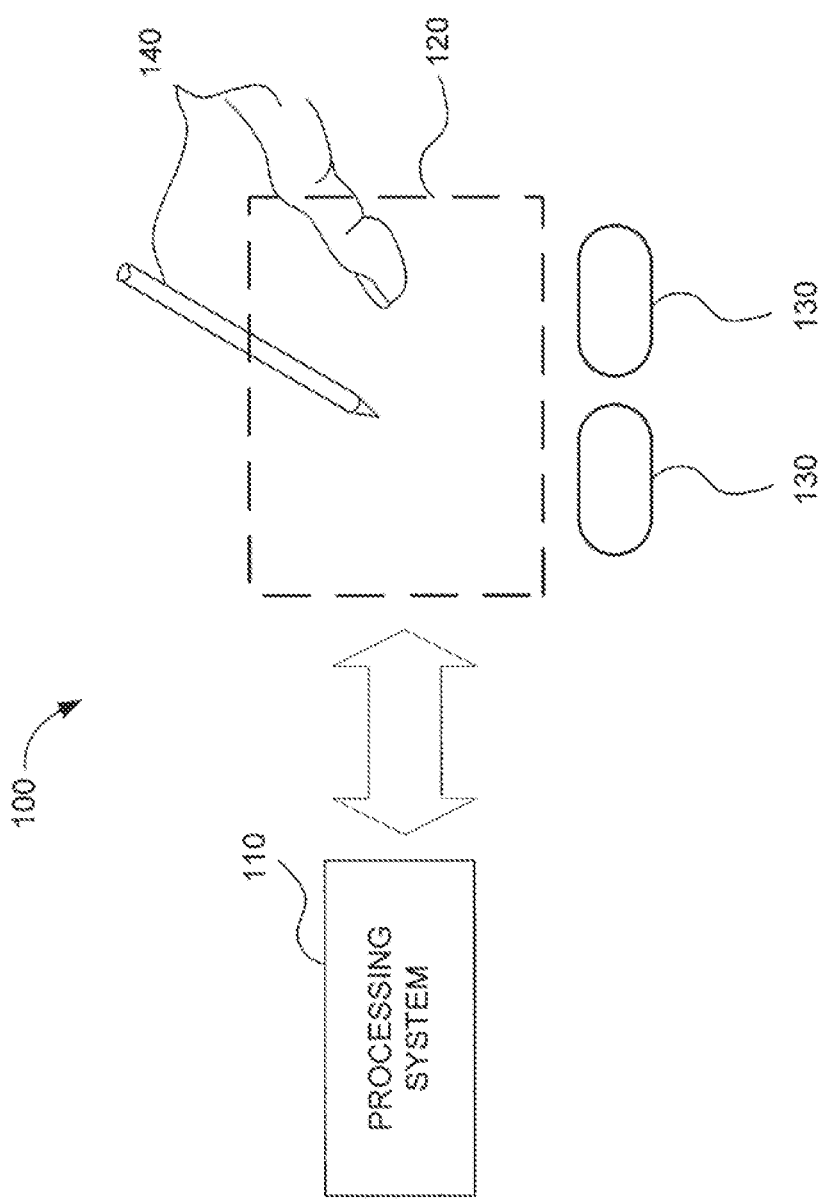
FIG. 1 is a block diagram of a system that includes an input device according to an example.

Turning now to the figures, FIG. 1 is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, scat-tip boxes, music players, digital photo frames, and digital cameras). Additionally, the electronic system could be a host or a slave to the input device.

The input device 100 can be implemented as a physical part of the electronic system or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device (also often referred to as a "touch pad" or a "touch sensor device") configured to sense input provided by one or more input objects 140 in a sensing region 120. Example input objects include fingers and styli, as shown in FIG. 1.

Sensing region 120 encompasses any space above, around, in, and/or rear the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques. Some implementations are configured to provide images that span one, two, three, or higher dimensional spaces. Some implementations are configured to provide projections of input along particular axes or planes. In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, changing the measured capacitive coupling. In one implementation, an absolute capacitance sensing method operates by modulating sensor electrodes with respect to a reference voltage (e.g., system ground) and by detecting the capacitive coupling between the sensor electrodes and input objects.

Some capacitive implementation "mutual capacitance" (or "transcapacitance") sensing methods based on changes in the capacitive coupling between sensor electrodes. In various embodiments, an input object near the sensor electrodes alters the electric field between the sensor electrodes, changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals and/or to one or more sources of environmental interference (e.g., other electromagnetic signals). Sensor electrodes may be dedicated transmitters or receivers, or sensor electrodes may be configured to both transmit and receive. Alternatively, the receiver electrodes may be modulated relative to ground.

In FIG. 1, a processing system 110 is shown as part of the input device 100. The processing system 110 is configured to operate the hardware of the input device 100 to detect input in the sensing region 120. The processing system 110 comprises parts of, or all of, one or more integrated circuits (ICs) and/or other circuitry components. For example, a processing system for a mutual capacitance sensor device may comprise transmitter circuitry configured to transmit signals with transmitter sensor electrodes and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100 and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing elements) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120 or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2A:
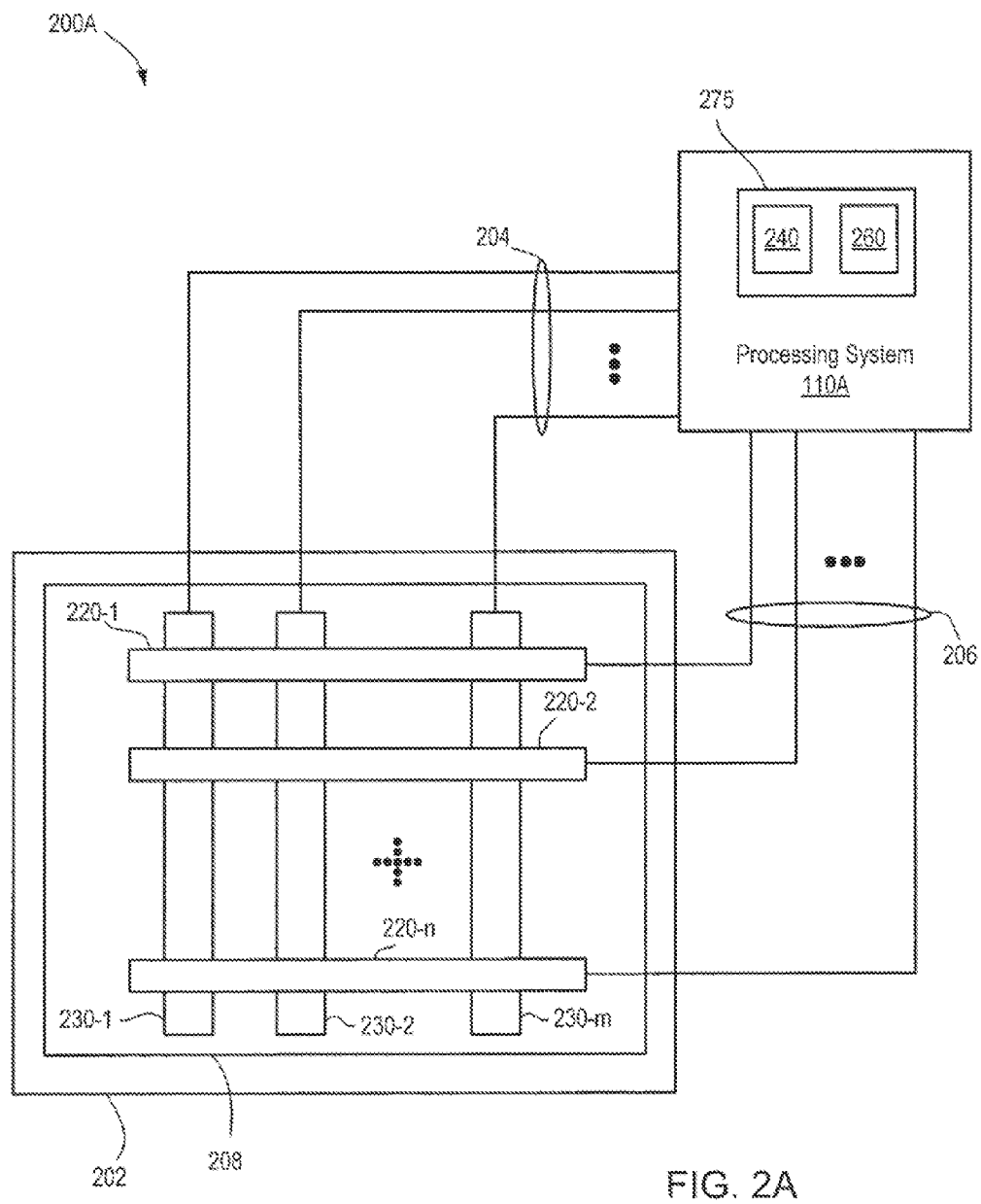
FIG. 2A is a block diagram depicting a capacitive sensor device according to an example.

FIG. 2A is a block diagram depicting a capacitive sensor device 200A according to an example. The capacitive sensor device 200A comprises an example implementation of the input device 100 shown in FIG. 1. The capacitive sensor device 200A includes a sensor electrode collection 208 coupled to an example implementation of the processing system 110 (referred to as "the processing system 110A"). As used herein, general reference to the processing system 110 is a reference to the processing system described in FIG. 1 or any other embodiment thereof described herein (e.g., the processing system 110A 110B, etc.).

The sensor electrode collection 208 is disposed on a substrate 202 to provide the sensing region 120. The sensor electrode collection 208 includes sensor electrodes disposed on the substrate 202. In the present example, the sensor electrode collection 208 includes two pluralities of sensor electrodes 220-1 through 220-N (collectively "sensor electrodes 220"), and 230-1 through 230-M (collectively "sensor electrodes 230"), where M and N are integers greater than zero. The sensor electrodes 220 and 230 are separated by a dielectric (not shown). The sensor electrodes 220 and the sensor electrodes 230 can be non-parallel, in an example, the sensor electrodes 220 are disposed orthogonally with the sensor electrodes 230.

In some examples, the sensor electrodes 220 and the sensor electrodes 230 can be disposed on separate layers of the substrate 202. In other examples, the sensor electrodes 220 and the sensor electrodes 230 can be disposed on a single layer of the substrate 202. While the sensor electrodes are shown disposed on a single substrate 202, in some embodiments, the sensor electrodes can be disposed on more than one substrate. For example, some sensor electrodes can be disposed on a first substrate, and other sensor electrodes can be disposed on a second substrate adhered to the first substrate.

In the present example, the sensor electrode collection 20$ is shown with the sensor electrodes 220, 200 generally arranged in a rectangular grid of intersections of orthogonal sensor electrodes. It is to be understood that the sensor electrode collection 208 is not limited to such an arrangement, but instead can include numerous sensor patterns. Although the sensor electrode collection 208 is depicted as rectangular, the sensor electrode collection 208 can have other shapes, such as a circular shape.

As discussed below, the processing system 110A can operate the sensor electrodes 220, 230 according to a plurality of excitation schemes, including excitation scheme(s) for mutual capacitance sensing ("transcapacitive sensing") and/or self-capacitance sensing ("absolute capacitive sensing"). In a transcapacitive excitation scheme, the processing system 110A drives the sensor electrodes 230 with transmitter signals (the sensor electrodes 230 are "transmitter electrodes"), and receives resulting signals from the sensor electrodes 220 (the sensor electrodes 220 are "receiver electrodes"). In some embodiments, sensor electrodes 220 may be transmitter electrodes and sensor electrodes 230 may be receiver electrodes. The sensor electrodes 230 can have the same or different geometry as the sensor electrodes 220. In an example, the sensor electrodes 230 are wider and more closely distributed than the sensor electrodes 220, which are thinner and more sparsely distributed. Similarly, in an embodiment, sensor electrodes 220 may be wider and/or more sparsely distributed. Alternatively, the sensor electrodes 220, 230 can have the same width and/or the same distribution.

The sensor electrodes 220 and the sensor electrodes 230 are coupled to the processing system 110A by conductive routing traces 204 and conductive routing traces 206, respectively. The processing system 110A is coupled to the sensor electrodes 220, 230 through the conductive routing traces 204, 206 to implement the sensing region 120 for sensing inputs. Each of the sensor electrodes 220 can be coupled to at least one routing trace of the routing traces 206. Likewise, each of the sensor electrodes 230 can be coupled to at least one routing trace of the routing traces 204.

Figure 2B:
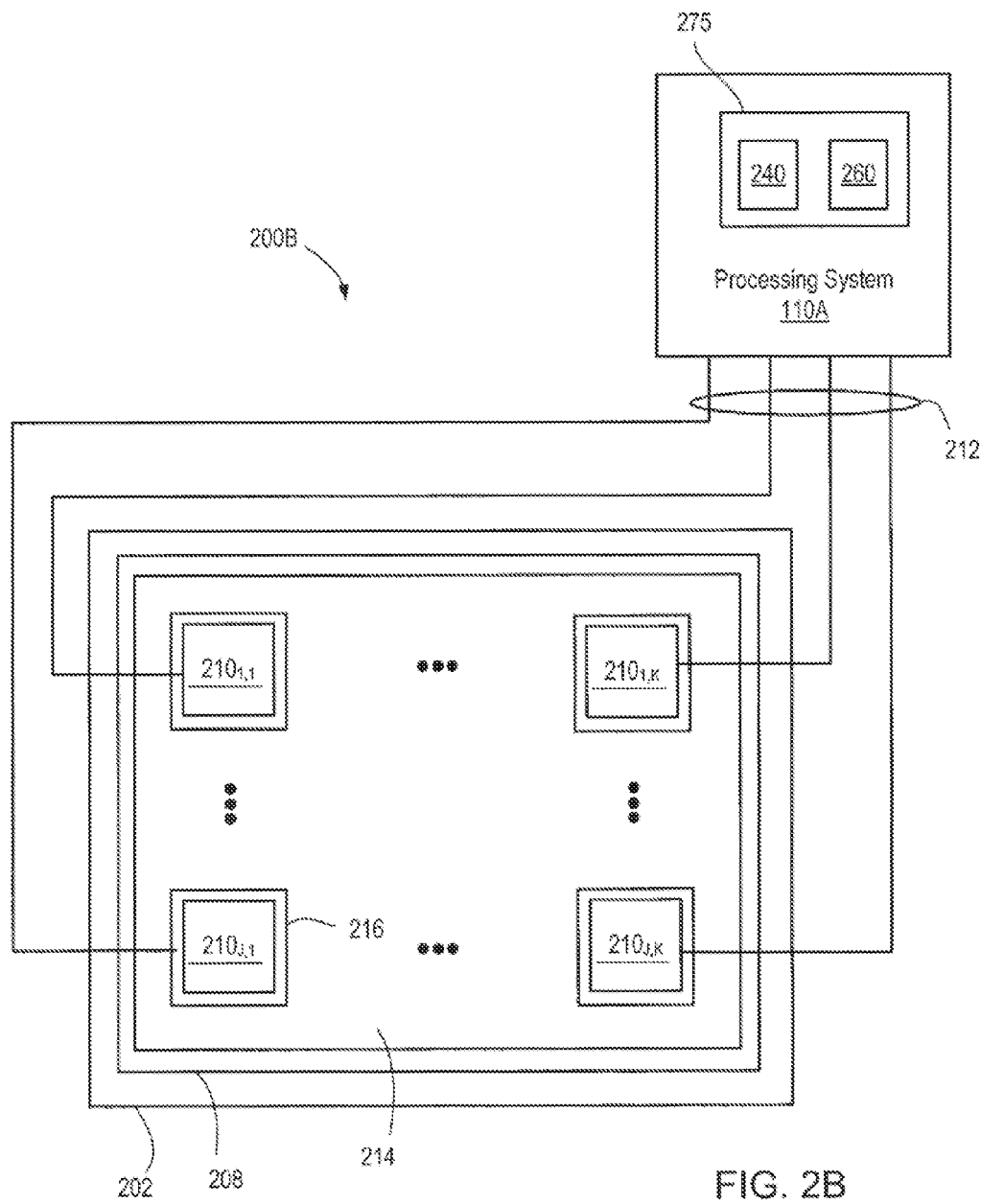
FIG. 2B is a block diagram depicting another capacitive sensor device according to an example.

FIG. 2B is a block diagram depicting a capacitive sensor device 200B according to an example. The capacitive sensor device 200B comprises another example implementation of the input device 100 shown in FIG. 1. In the present example, the sensor electrode collection 208 includes a plurality of sensor electrodes $210_{1,1}$ through $210_{J,K}$, where J and K are integers (collectively "sensor electrodes 210"). The sensor electrodes 210 are capacitively coupled to a grid electrode 214. The sensor electrodes 210 are ohmically isolated from each other and the grid electrode 214. The sensor electrodes 210 can be separated from the grid electrode 214 by a gap 216. In the present example, the sensor electrodes 210 are arranged in a rectangular matrix pattern, where at least one of J or K is greater than zero. The sensor electrodes 210 can be arranged in other patterns, such as polar arrays, repeating patterns, non-repeating patterns, or like type arrangements. Similar to the capacitive sensor device 200A, the processing system 110A can operate the sensor electrodes 210 and the grid electrode 214 according to a plurality of excitation schemes, including excitation scheme(s) for transcapacitive sensing and/or absolute capacitive sensing.

In some examples, the sensor electrodes 210 and the grid electrode 214 can be disposed on separate layers of the substrate 202. In other examples, the sensor electrodes 210 and the grid electrode 214 can be disposed on a single layer of the substrate 202. The sensor electrodes 210 can be on the same and/or different layers as the sensor electrodes 220 and the sensor electrodes 230. While the sensor electrodes are shown disposed on a single substrate 202, in some embodiments, the sensor electrodes can be disposed on more than one substrate. For example, some sensor electrodes can be disposed on a first substrate, and other sensor electrodes can be disposed on a second substrate adhered to the first substrate.

The sensor electrodes 210 are coupled to the processing system 110A by conductive routing traces 212. The processing system 110A can also be coupled to the grid electrode 214 through one or more routing traces (not shown for clarity). The processing system 110A is coupled to the sensor electrodes 210 through the conductive routing traces 212 to implement the sensing region 120 for sensing inputs.

Referring to FIGS. 2A and 2B, the capacitive sensor device 200A or 200B can be utilized to communicate user input (e.g., a user's finger, a probe such as a stylus, and/or some other external input object) to an electronic system (e.g., computing device or other electronic device). For example, the capacitive sensor device 200A or 200B can be implemented as a capacitive touch screen device that can be placed over an underlying image or information display device (not shown). In this manner, a user would view the underlying image or information display by looking through substantially transparent elements in the sensor electrode collection 208. When implemented in a touch screen, the substrate 202 can include at least one substantially transparent layer (not shown). The sensor electrodes and the conductive routing traces can be formed of substantially transparent conductive material. Indium tin oxide (ITO) and/or thin, barely visible wires are but two of many possible examples of substantially transparent material that can be used to form the sensor electrodes and/or the conductive routing traces. In other examples, the conductive routing traces can be formed oaf non-transparent material, and then hidden in a border region (not shown) of the sensor electrode collection 208.

In another example, the capacitive sensor device 200A or 200B can be implemented as a capacitive touchpad, slider, button, or other capacitance sensor. For example, the substrate 202 can be implemented with, but not limited to, one or more clear or opaque materials. Likewise, clear or opaque conductive materials can be utilized to form sensor electrodes and/or conductive routing traces for the sensor electrode collection 208.

In general, the processing system 110A excites or drives sensing elements of the sensor electrode collection 208 with a sensing signal and measures an induced or resulting signal that includes the sensing signal and effects of input in the sensing region 120. The terms "excite" and "drive" as used herein encompasses controlling some electrical aspect of the driven element. For example, it is possible to drive current through a wire, drive charge into a conductor, drive a substantially constant or varying voltage waveform onto an electrode, etc. A sensing signal can be constant, substantially constant, or varying over time, and generally includes a shape, frequency, amplitude, and phase. A sensing signal can be referred to as an "active signal" as opposed to a "passive signal," such as a ground signal or other reference signal. A sensing signal can also be referred to as a "transmitter signal" when used in transcapacitive sensing, or an "absolute sensing signal" or "modulated signal" when used in absolute sensing.

In example, the processing system 110A drives sensing element(s) of the sensor electrode collection 208 with a voltage and senses resulting respective charge on sensing element(s). That is, the sensing signal is a voltage signal and the resulting signal is a charge signal (e.g., a signal indicative of accumulated charge, such as an integrated current signal). Capacitance is proportional to applied voltage and inversely proportional to accumulated charge. The processing system 110A can determine measurement(s) of capacitance from the sensed charge. In another example, the processing system 110A drives sensing element(s) of the sensor electrode collection 208 with charge and senses resulting respective voltage on sensing element(s). That is, the sensing signal is a signal to cause accumulation of charge (e.g., current signal) and the resulting signal is a voltage signal. The processing system 110A can determine measurement(s) of capacitance from the sensed voltage. In general, the term "sensing signal" is meant to encompass both driving voltage to sense charge and driving charge to sense voltage, as well as any other type of signal that can be used to obtain indicia of capacitance. "Indicia of capacitance" include measurements of charge, current, voltage, and the like, from which capacitance can be derived.

The processing system 110A can include a sensor module 240 and a determination module 260. The sensor module 240 and the determination module 260 comprise modules that perform different functions of the processing system 110A. In other examples, different configurations of one or more modules can perform the functions described herein. The sensor module 240 and the determination module 260 can include circuitry 275 and can also include firmware, software, or a combination thereof operating in cooperation with the circuitry 275.

The sensor module 240 selectively drives sensing signal(s) on one or more sensing elements of the sensor electrode collection 208 over one or more cycles ("excitation cycles") in accordance with one or more schemes ("excitation schemes"). During each excitation cycle, the sensor module 240 can selectively sense resulting signal(s) from one or more sensing elements of the sensor electrode collection 208. Each excitation cycle has an associated time period during which sensing signals are driven and resulting signals measured.

In one type of excitation scheme, the sensor module 240 can selectively drive sensing elements of the sensor electrode collection 208 for absolute capacitive sensing. In absolute capacitive sensing, the sensor module 240 drives selected sensing element(s) with an absolute sensing signal and senses resulting signal(s) from the selected sensing element(s). In such an excitation scheme, measurements of absolute capacitance between the selected sensing element(s) and input object(s) are determined from the resulting signal(s). In an example, the sensor module 240 can drive selected sensor electrodes 220, and/or selected sensor electrodes 230, with an absolute sensing signal. In another example, the sensor module 240 can drive selected sensor electrodes 210 with an absolute sensing signal.

In another type of excitation scheme, the sensor module 240 can selectively drive sensing elements of the sensor electrode collection 208 for transcapacitive sensing. In transcapacitive sensing, the sensor module 240 drives selected transmitter sensor electrodes with transmitter signal(s) and senses resulting signals from selected receiver sensor electrodes. In such an excitation scheme, measurements of transcapacitance between transmitter and receiver electrodes are determined from the resulting signals. In an example, the sensor module 240 can drive the sensor electrodes 230 with transmitter signal(s) and receive resulting signals on the sensor electrodes 220. In another example, the sensor module 240 can drive selected sensor electrodes 210 with transmitter signal(s), and receive resulting signals from others of the sensor electrodes 210.

In any excitation cycle, the sensor module 240 can drive sensing elements of the sensor electrode collection 208 with other signals, including reference signals and guard signals. That is, those sensing elements of the sensor electrode collection 208 that are not driven with a sensing signal, or sensed to receive resulting signals, can be driven with a reference signal, a guard signal, or left floating (i.e., not driven with any signal). A reference signal can be a ground signal (e.g., system ground) or any other constant or substantially constant voltage signal. A guard signal can be a signal that is similar or the same in at least one of shape, amplitude, frequency, or phase of a transmitter signal.

"System ground" may indicate a common voltage shared by system components. For example, a capacitive sensing system of a mobile phone can, at times, be referenced to a system ground provided by the phone's power source (e.g., a charger or battery). The system ground may not be fixed relative to earth or any other reference. For example, a mobile phone on a table usually has a floating system ground. A mobile phone being held by a person who is strongly coupled to each ground through free space may be grounded relative to the person, but the person-ground may be varying relative to earth ground. In many systems, the system ground is connected to, or provided by, the largest area electrode in the system. The capacitive sensor device 200A or 200B can be located proximate to such a system ground electrode (e.g., located above a ground plane or backplane).

The determination module 260 performs capacitance measure cents based on resulting signals obtained by the sensor module 240. The capacitance measurements can include changes in capacitive couplings between elements (also referred to as "changes in capacitance"). For example, the determination module 260 can determine baseline measurements of capacitive couplings between elements without the presence of input object(s). The determination module 260 can then combine the baseline measurements of capacitive couplings with measurements of capacitive couplings in the presence of input object(s) to determine changes in capacitive couplings.

In an example, the determination module 260 can perform a plurality of capacitance measurements associated with specific portions of the sensing region 120 as "capacitive pixels" to create a "capacitive image" or "capacitive frame." A capacitive pixel of a capacitive image represents a location within the sensing region 120 in which a capacitive coupling can be measured using sensing elements of the sensor electrode collection 208. For example, a capacitive pixel can correspond to a transcapacitive coupling between a sensor electrode 220 and a sensor electrode 230 affected by input object(s). In another example, a capacitive pixel can correspond to an absolute capacitance of a sensor electrode 210. The determination module 260 can determine an array of capacitive coupling changes using the resulting signals obtained by the sensor module 240 to produce an x-by-y array of capacitive pixels that form a capacitive image. The capacitive image can be obtained using transcapacitive sensing (e.g., transcapacitive image), or obtained using absolute capacitive sensing (e.g., absolute capacitive image). In this manner, the processing system 110A can capture a capacitive image that is a snapshot of the response measured in relation to input object(s) in the sensing region 120. A given capacitive image can include all of the capacitive pixels in the sensing region, or only a subset of the capacitive pixels.

In another example, the determination module 260 can perform a plurality of capacitance measurements associated with a particular axis of the sensing region 120 to create a "capacitive profile" along that axis. For example, the determination module 260 can determine an array of absolute capacitive coupling changes along an axis defined by the sensor electrodes 220 and/or the sensor electrodes 230 to produce capacitive profile(s). The array of capacitive coupling changes can include a number of points less than or equal to the number of sensor electrodes along the given axis.

Measurement(s) of capacitance by the processing system 110A, such as capacitive image(s) or capacitive profile(s), enable the sensing of contact, hovering, or other user input with respect to the formed sensing regions by the sensor electrode collection 208. The determination module 260 can utilize the measurements of capacitance to determine positional information with respect to a user input relative to the sensing regions formed by the sensor electrode collection 208. The determination module 260 can additionally or alternatively use such measurement(s) to determine input object size and/or input object type.

Figure 3A:
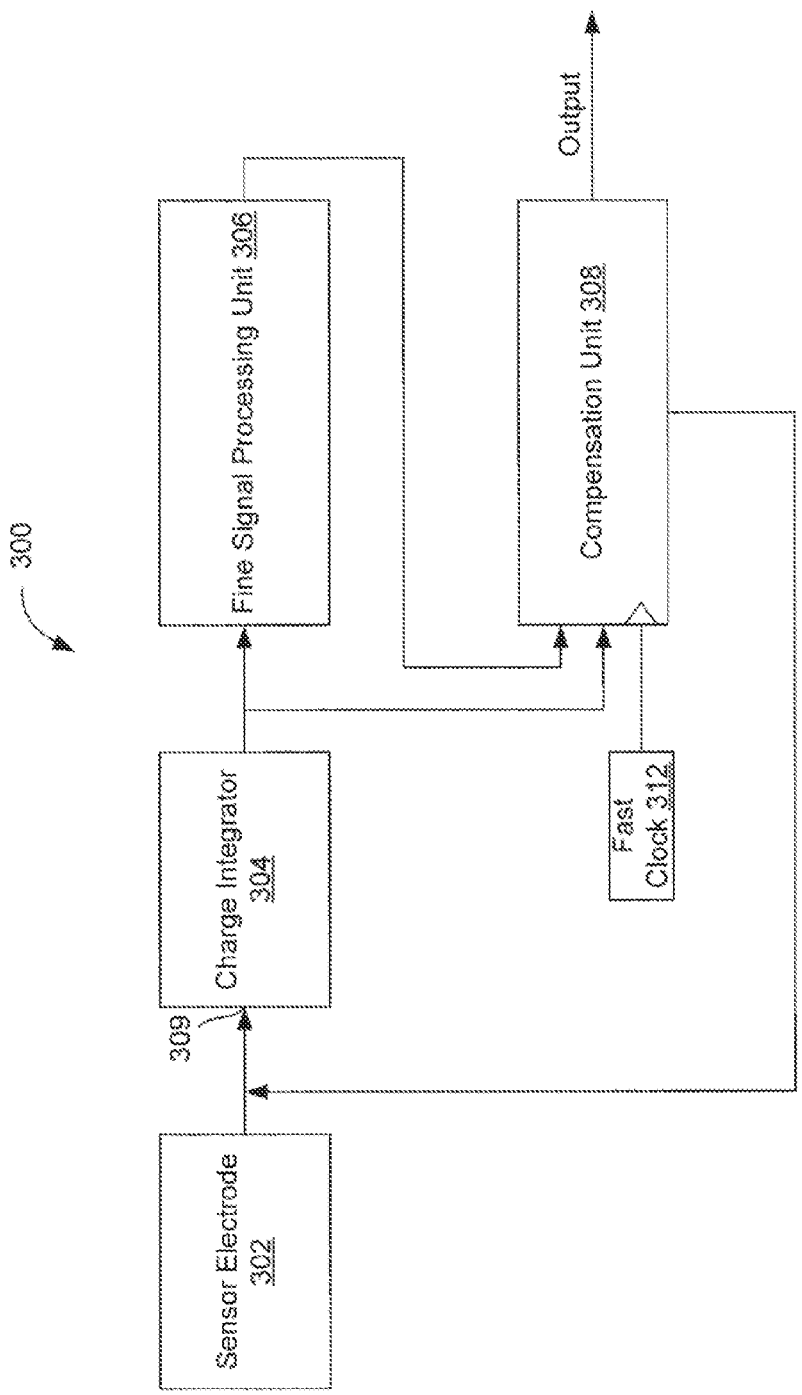
FIG. 3A is a block diagram of a hybrid-dynamic-ran processing system, according to an example.

FIG. 3A is a block diagram of a hybrid-dynamic-range processing system 300, according to an example. As shown, the hybrid-dynamic-range processing system 300 includes a charge integrator 304 coupled to a sensor electrode 302, a fine signal processing unit 306, and a compensation unit 308. The sensor electrode 302 may be any of the sensor electrodes 210, 220, 230 described above with respect to FIGS. 2A-2B. Any or all of the charge integrator 304, fine signal processing unit 306, and compensation unit 308 may be included within the processing system 110 described above with respect to FIGS. 1-2B.

As described above, sensor electrode 302 is driven with a sensing signal in order to sense presence of an input object 140. In response, sensor electrode 302 provides a signal to charge integrator 304. Charge integrator 304 converts the continuous analog signal received from sensor electrode 302 to a sampled analog signal by integrating the amount of charge received by (or drawn from) charge integrator 304 from sensor electrode 302 during a particular period of time. This period may be an integration period within a half-cycle of the driving signal that drives the sensor electrode 302 for capacitive sensing. The sampled analog signal is processed further to derive an output signal that is indicative of the capacitance of sensor electrode 302, as modified by an input object 140 if present.

Charge integrator 304 has a dynamic range, which is the range of charge drawn or provided by sensor electrode 302 to charge integrator 304 over which the output voltage of charge integrator 304 responds linearly. Outside of this range, the output voltage of charge integrator 304 does not respond linearly. This voltage may "rail" or remain at one of the power supply voltages powering charge integrator 304 while charge integrator 304 operates outside of its dynamic range. The condition of operating outside of its dynamic range may be referred to as the charge integrator 304 being "saturated" or operating "in saturation" herein.

The dynamic range of charge integrator 304 is dependent on, among other things, an internal feedback capacitance of the charge integrator 304. A greater feedback capacitance increases the dynamic range and a smaller feedback capacitance decreases the dynamic range.

While increasing the feedback capacitance of the charge integrator 304 increases the dynamic range of the charge integrator 304, a larger capacitor occupies a larger amount of space on an integrated circuit. Thus, the fine signal processing unit 306 and compensation unit 308 are provided so that a capacitor that provides feedback capacitance for charge integrator 304 may be made smaller, in order to reduce the amount of space occupied by charge integrator 304 within processing system 110.

The compensation unit 308 performs several functions to assist with compensating for the reduced dynamic range of the charge integrator 304. Specifically, the compensation unit 308 removes or adds charge to input node 309 in order to prevent charge integrator from operating in saturation. Compensation unit 308 adds or removes charge in same-sized, discrete "chunks" of charge. The element (e.g., the compensation unit 308) that adds or removes charge may be embodied as circuitry that adds or removes the same amount of charge regardless of the voltage at input node 309 and thus operates independent of that voltage. Compensation unit 308 also records how much charge is added or removed from input node 309 as a "coarse input signal" and processes this coarse input signal in parallel with a fine signal processing unit 306 processing a fine input signal associated with a finer measurement of charge at input node. The fine input signal can be thought of as a "remainder" after the compensation unit 308 adds or subtracts the charge a fixed number of times. Results from coarse and fine processing are added together to obtain a final output signal that is the same as if the feedback capacitor in charge integrator 304 were large enough to accommodate a large enough dynamic rant a for the particular signal input from sensor electrode 302.

In operation, during any particular sensing half-cycle, the compensation unit 308 detects whether the output of charge integrator 304 is above a high threshold or below a low threshold. These thresholds may be any value, but are preferably values used to detect when charge integrator 304 is close to, or is, operating in saturation. Thus, the thresholds may be near to maximum and minimum values that indicate when charge integrator 304 would be about to transition from operating linearly to operating in saturation.

When the compensation unit 308 detects that the output of charge integrator 304 is above a high threshold or below a low threshold, the compensation unit 308 adds charge to or removes charge from the input 309 to charge integrator 304. By changing the amount of charge at input 309, compensation unit 308 moves charge integrator 304 from operating in saturation (or nearly operating in saturation) to operating closer to the middle of its dynamic range.

The compensation unit 308 is clocked by fast clock 312, which is faster than the frequency of the signal with which sensor electrode 302 is driven. The purpose of this fast clock 312 is so that, if desired, charge may be removed (or added) multiple times from (or to) input node 309 in a sensing half-cycle. During each half-cycle, the compensation unit 308 records a count of the number of times that charge has been added to or removed from input 309 during that half-cycle. The compensation unit 308 determines the total amount of charge removed from or added to input 309 by multiplying that count by an amount of charge added or removed each time. This value is referred to herein a coarse charge value or a coarse sensing result.

When compensation unit 308 no longer detects that the output of charge integrator 304 is above a high threshold or below a low threshold, the compensation unit 308 performs processing on the coarse sensing result to obtain a coarse logic output. Also at this time, the fine signal processing unit 306 receives en output signal from charge integrator 304, and performs processing on that output signal to obtain a digital fine logic output. Compensation unit 308 receives the digital fine logic output and adds the fine logic output to the coarse logic output to obtain a final output that is representative of the amount of charge output or drawn by sensor electrode 302 to charge integrator 304. Note that the processing being performed by compensation unit 308 and fine signal processing unit 306 may include demodulation, filtering, and/or other types of processing. The processing would be done both on the coarse charge value and on a fine value processed by fine signal processing unit 306.

More specifically, both compensation unit 308 and fine signal processing unit 306 perform certain signal processing on coarse and fine signals, respectively. This signal processing would be whatever processing is desired to convert the signal as received from charge integrator 304 into a format more useful for indicating capacitance of sensor electrode 302. The signal processing may include demodulation and filter, for example. The compensation unit 308 performs this processing on the coarse charge value and the fine signal processing unit 306 performs analogous processing on the signal received from charge integrator 304 after compensation unit 308 no longer detects that signal to be above or below a threshold. Thus, analogous processing is performed both on the coarse value and on the fine value. The output of this processing can simply be added together to obtain a single result that incorporates information from both the coarse and fine values.

Conceptually, the compensation unit 308 can be thought of as increasing or improving the dynamic range of charge integrator 304, or alternatively, as compensating for instances when the charge integrator 304 operates or is about to operate in saturation. By adding or removing charge from input 309 when charge integrator 304 operates or is about to operate in saturation, compensation unit 308 effectively provides additional range of input charge values over which charge integrator 304 is able to operate linearly. Further, compensation unit 308 is able to produce a single output value that is indicative of the amount of charge output or drawn by sensor electrode 302 by processing the coarse sensing result and adding those processed results to fine sensing results generated by fine signal processing unit 306.

An additional benefit of compensation unit 308 is that compensation unit 308 is able to calibrate fine signal processing unit 306. More specifically, the output signal from charge integrator 304, while indicative of the total amount of charge received at input node 309 an integration period, is not calibrated to the actual amount of charge received at input node 309. Because compensation unit 308 adds or removes charge from input node 309 in discrete chunks, compensation unit 308 is able to help correlate output values at charge integrator 304 to actual charge amounts at input node 309. This process is referred to herein as "calibration" or "self-calibration." In other embodiments, the fine signal processing unit 306 may be used to calibrate a coarse signal processing unit.

To perform this calibration, compensation unit 308 adds charge to or removes charge from input 309 when sensor electrode 302 is not driven for capacitive sensing. Fine signal processing unit 306 receives an input from charge integrator 304 and converts this input to a digital value, which is output to compensation unit 308. During this calibration, the fine signal processing unit 306 does not perform any processing on the signal received from charge integrator 304 (such as demodulation and filtering) and only converts that signal to a digital value. Compensation unit 308 stores this digital value as a calibration value. The calibration value correlates digital values from the fine signal processing unit 306 to an amount of charge added or subtracted by compensation unit 308 each time charge is added or subtracted. For example, if, when compensation unit 308 adds charge to input 309 for self-calibration, fine signal processing unit 306 outputs a value of 100, then the calibration value correlates this value of 100 with the amount of charge that is added when compensation unit 308 adds charge to input 309. If the amount of charge added or subtracted by compensation unit 308 each time is known, then compensation unit 308 is able to directly store a correlation between values from fine signal processing unit 306 and charge.

Figure 3B:
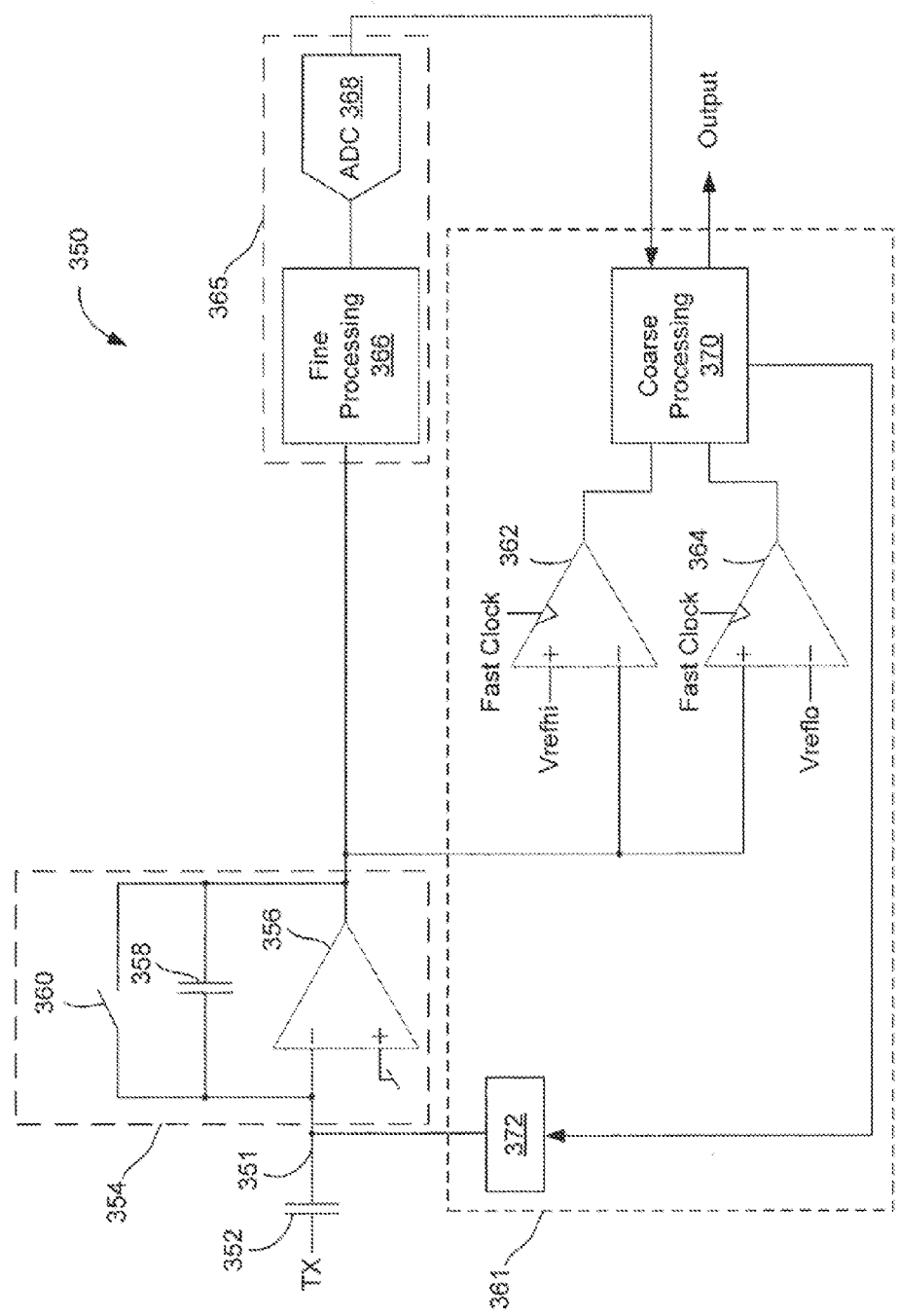
FIG. 3B is a circuit diagram of an example hybrid-dynamic-range processing system that is an implementation of hybrid-dynamic-range processing system of FIG. 3A, according to an example.

FIG. 3B is a circuit diagram of an example hybrid-dynamic-range processing system 350 that is an implementation of hybrid-dynamic-range processing system 300 of FIG. 3A, according to an example. The hybrid-dynamic-range processing system 350 includes a charge integrator 354 coupled to a sensor electrode 352, a fine signal processing unit 365, and a compensation unit 361. The charge integrator 354 is an implementation of charge integrator 304. The fine signal processing unit 365 is an implementation of fine signal processing unit 306 and the compensation unit 361 is an implementation of compensation unit 308.

The charge integrator 354 includes an operational amplifier 356, a feedback capacitor 358 coupled between the output and non-inverting input of the operational amplifier 358, and a reset switch 360 coupled in parallel with the feedback capacitor 358. The inverting input of the operational amplifier 356 is coupled to a reference voltage. The fine signal processing unit 365 includes a fine signal processing module 366 and an analog-to-digital converter 368. The compensation unit 361 includes a high-voltage comparator 362, a low-voltage comparator 364, a coarse processing unit 370, and a charge modifying unit 372.

In operation, processing system 110 (FIGS. 1-2B) drives sensor electrode 352 with a signal—labeled as "TX" for "transmitter"—for capacitive sensing. Note that although sensing is illustrated as being transcapacitive sensing, absolute sensing is possible as well. In response to being driven with a signal, sensor electrode 352 flows charge to (or draws charge from, depending on the polarity of the transmitter signal) charge integrator 354.

The charge change at input node 351 causes a transient voltage change at input node 351. This transient voltage change is corrected by action of the operational amplifier 356. More specifically, feedback through feedback capacitor 358 returns input node 351 to a virtual ground. The polarity of the output of the operational amplifier 356 is the reverse of the polarity of the transmitter signal in the current half-cycle. Thus if the transmitter signal is a high voltage, the output of the operational amplifier 356 is a low voltage and if the transmitter signal is a low voltage, the output of the operational amplifier 356 is a high voltage.

As discussed above, charge integrator 354 has a dynamic range within which charge integrator 354 operates linearly and outside of which charge integrator 354 is considered to be in saturation. The dynamic range is the range of values over which the output of the operational amplifier 356 is able to compensate for the increase or decrease in charge at input node 351. At some maximum or minimum amount of charge, the output voltage of operational amplifier 356 is substantially equal to the power supply or ground voltage of operational amplifier 356. No further voltage increases or decreases are possible, and thus the feedback mechanism across feedback capacitor 358 is unable to further compensate for change in charge increase or decrease at input node 351. At this point, the voltage at input node 351 no longer remains at virtual ground and begins increasing or decreasing.

The hybrid-dynamic-range processing system 350 helps to improve the dynamic range of the charge integrator 354 by adding or subtracting charge from input node 351 when the output of operational amplifier 356 is in danger of operating in saturation. Each time charge is added or subtracted from input node 351, the charge integrator 354 is brought closer to the middle of its dynamic range.

Note that the charge integrator 354 is reset by reset switch 360 prior to the transmitter signal transitioning from low to high or high to low. Thus, the voltage difference across feedback capacitor 358 is reduced to zero. After this, the transmitter signal switches polarity and drives sensor electrode again 352.

The output signal from charge integrator 354 is provided to fine signal processing unit 365 and to compensation unit 361. Within compensation unit 361, both high voltage comparator 362 and low voltage comparator 364 receive this output signal. High voltage comparator 362 is an operational amplifier with non-inverting input coupled to a high reference voltage and inverting input coupled to output from charge integrator 354. When that output is below the high reference voltage, high voltage comparator 362 outputs a logical high to coarse processing unit 370. Low voltage comparator 364 is an operational amplifier with inverting input coupled to a low reference voltage and non-inverting input coupled to the output from the charge integrator 354. When that output is above the low reference voltage, low voltage comparator 364 outputs a logical high to coarse processing unit 370. Both high voltage comparator 362 and low voltage comparator 364 are clocked by fast clock 312 (FIG. 3A). This means that the outputs of each of these comparators are emitted once per fast clock cycle, assuming the respective voltage comparator condition is met. Note that the terms "high reference voltage" and "low reference voltage" are chosen to correspond to the polarity of the input node 351, rather than the polarity of the output of operational amplifier 356. Thus, the high voltage comparator 382 indicates when the voltage at the input node 351 is too high and the low voltage comparator 364 indicates when the voltage at the input node 351 is too low.

Coarse processing unit 370 performs three functions: controlling charge modifying unit 372 to add or remove charge from input node 351 based on the output of comparators 362, 364; recording a coarse sensing result that is equal to the number of times charge modifying unit 372 adds or removes charge to or from input node 351 in a sensing half-cycle; and processing the coarse sensing result and a fine sensing result from fine signal processing unit 365 to generate an output.

When coarse processing unit 370 receives a high value from high voltage comparator 362, coarse processing unit 370 controls charge modifying unit 372 to subtract charge from input node 351 (since high voltage comparator 362 indicates when voltage at input node 351 is too high, as described above) and increments a count of the number of times that charge is subtracted from input node 351. This count may be stored as a positive value, since the charge at input node 351 is high. For example, if charge is subtracted 5 times, the count is +5. Similarly, when coarse processing unit 370 receives a high value from low voltage comparator 364, coarse processing unit 370 controls charge modifying unit 372 to add charge to input node 351 and increments a count of the number of times that charge is added to input node 351. This count may be stored as a negative value, since the charge at input node 351 is low. For example, if charge is added 5 times, the count is −5. The count that results from adding charge to or subtracting charge from input node 351 is referred to herein as a charge modification count.

When neither high voltage comparator 362 nor low voltage comparator 364 outputs a high signal, course processing unit 370 determines that no charge needs to be added or subtracted from input node 351. At this point, coarse processing unit 370 determines a total amount of charge added to or subtracted from input node 361 in the current sensing half-cycle. To determine the total amount of charge added or subtracted to or from input node 351, coarse processing unit 370 multiplies the charge modification count by an amount of charge added or subtracted each time charge is added or subtracted from the input node 351. The result is a charge modification amount. The amount of charge added or subtracted each time may be determined based on the characteristics of the charge modifying unit 372, some examples of which are described in further detail below. Charge modifying unit 372 may be embodied as circuitry that adds or removes the same amount of charge regardless of the voltage at input node 351 and thus operates independent of the voltage at the inverting input of the operational amplifier 356.

Both fine signal processing unit 365 and coarse processing unit 370 perform signal processing. Fine signal processing unit 366 performs signal processing on output from the charge integrator 354 that exists after compensation unit 361 determines that no more charge should be added or removed. This signal processing includes demodulation and filtering as well as analog-to-digital conversion. Although analog-to-digital converter 368 is depicted as being after fine signal processing module 366 (meaning that fine signal processing module 366 performs processing in the analog domain), analog-to-digital converter 368 may be before fine signal processing module 366 (meaning that fine signal processing module 366 would perform processing in the digital domain). Fine signal processing unit 365 provides processed output to coarse processing unit 370.

The coarse processing unit 370 performs processing, including demodulation and filtering, on the charge modification amount, to generate a coarse logic output. Coarse processing unit 370 also adds the coarse logic output to the processed fine signal to generate a processed signal output, which is a digital value that is representative of the amount of charge drawn by or provided by sensor electrode 352.

At the end of a half-cycle, after this processed signal output is generated, charge integrator 354 closes reset switch 360 to prepare for the next sensing half-cycle. Coarse processing unit 370 also resets the count of the number of times charge is subtracted from or added to input node 351.

A mathematical explanation for the equivalence between adding the coarse logic signal to fine logic signal and processing a single signal from a charge integrator 354 with larger feedback capacitor 358 is now provided. With a single signal from a charge integrator 354 with large feedback capacitor 358 (an "unsplit signal" Q[n]), that signal is demodulated and filtered as follows:

$$x_Q[n] = Q[n] \cdot demod[n]$$

$$y_Q[n] = \sum_{i=0}^{M} b_i x_q[n-i] - \sum_{i=1}^{N} a_i y_Q[n-i]$$

Q[n]: "unsplit signal": a single signal from charge integrator
$x_Q[n]$: demodulated signal
$y_Q[n]$: filtered, demodulated signal
$a_i$, $b_i$: filtering constants With the techniques disclosed herein, Q[n] is effectively divided into a coarse signal D[n] and a fine signal q[n]. These signals are demodulated and filtered as follows:

$$x[n] = q[n] \cdot demod[n]$$

$$y[n] = \sum_{i=0}^{M} b_i x[n-i] - \sum_{i=1}^{N} a_i y[n-i]$$

$$X[n] = D[n] \cdot demod[n]$$

$$Y[n] = \sum_{i=0}^{M} b_i X[n-i] - \sum_{i=1}^{N} a_i Y[n-i]$$

The sum of the filtered, demodulated signals for the coarse and fine signals is as follows:

$$\begin{aligned} Y[n] + y[n] &= \sum_{i=0}^{M} b_i X[n-i] - \sum_{i=1}^{N} a_i Y[n-i] + \\ &\quad \sum_{i=0}^{M} b_i x[n-i] - \sum_{i=1}^{N} a_i y[n-i] \\ &= \sum_{i=0}^{M} b_i (X[n-i] + x[n-i]) - \sum_{i=1}^{N} a_i (Y[n-i] + y[n-i]) \\ &= \sum_{i=0}^{M} b_i (D[n-i]demod[n-i] + q[n-i]demod[n-i]) - \\ &\quad \sum_{i=1}^{N} a_i (Y[n-i] + y[n-i]) \\ &= \sum_{i=0}^{M} b_i de\!\mod[n-i](D[n-i] + q[n-i]) - \\ &\quad \sum_{i=1}^{N} a_i (Y[n-i] + y[n-i]) \\ &= \sum_{i=0}^{M} b_i de\!\mod[n-i] x_Q[n-i] - \\ &\quad \sum_{i=1}^{N} a_i (Y[n-i] + y[n-i]) \\ \Rightarrow y_Q[n] &= Y[n] + y[n] \end{aligned}$$

Thus, the filtered, demodulated unsplit signal is equivalent to the sum of the filtered, demodulated coarse and fine signals.

Figure 4:
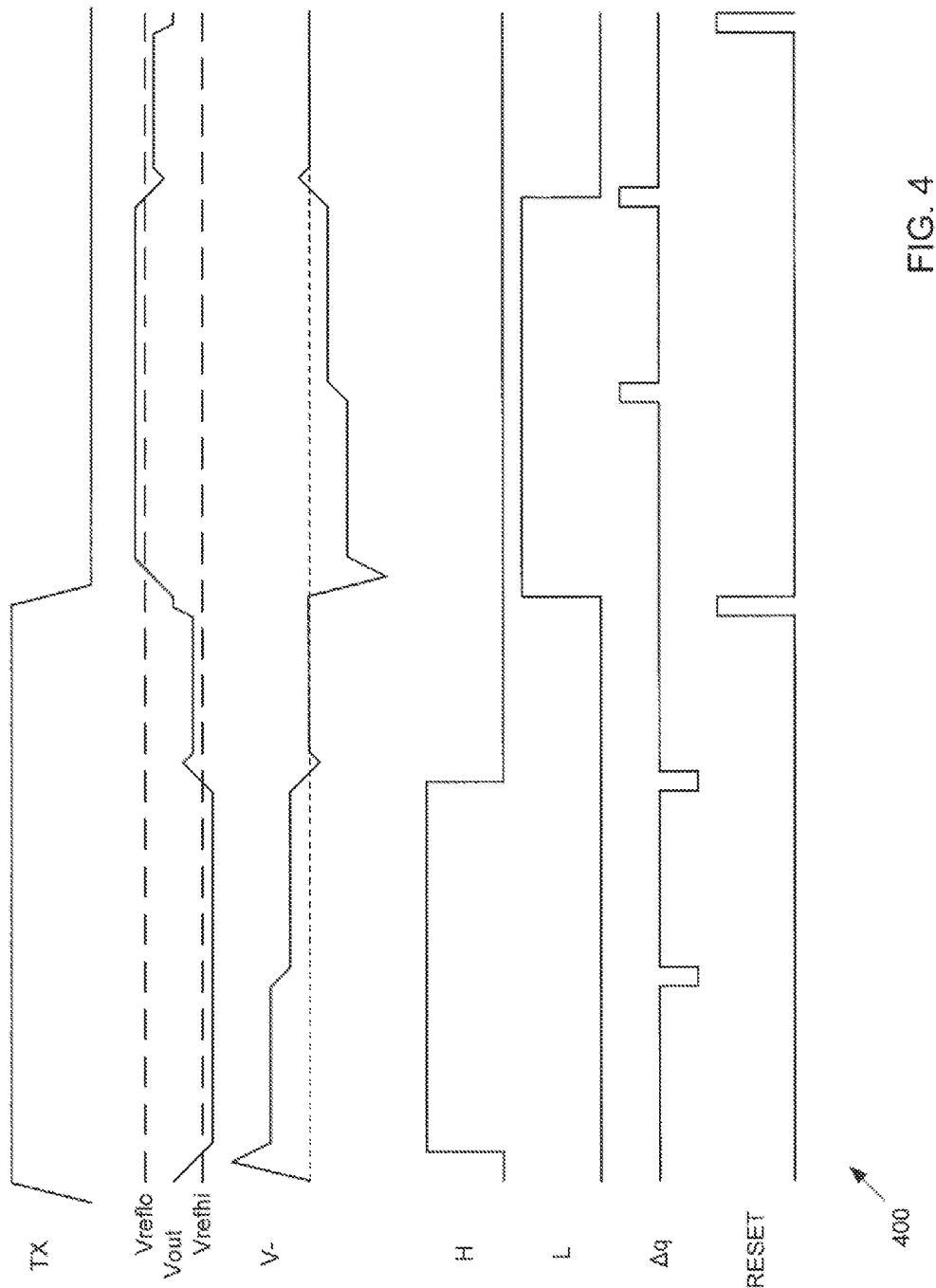
FIG. 4 is a graph that illustrates various signals within hybrid-dynamic-range processing system, according to an example.

FIG. 4 is a graph that illustrates various signals within hybrid-dynamic-range processing system 350, according to an example. The signals include a transmitter signal ("TX"), a charge integrator output signal ("Vout"), a signal corresponding to the inverting input of the operational amplifier 356 of the charge integrator 354 (V−), a signal corresponding to the output of high voltage comparator 362 ("H"), a signal corresponding to the output of low voltage comparator 364 ("L"), a signal corresponding to the charge modifying unit 372. ("Δq"), and a signal corresponding to the reset switch 360. It should be noted that, in some cases, the graph of FIG. 4 is an estimate of expected waveforms in some embodiments and does not limit the disclosed invention to corresponding implementations.

Referring to FIGS. 3 and 4 together, the transmitter signal drives sensor electrode 352 with a driving signal for capacitive sensing. One full cycle, for the transmitter, in which the transmitter signal transitions from low to high and then from high to low, is shown in FIG. 4. The period of time between a high-to-low and low-to-high transition is referred to as a half-cycle.

In the first half-cycle illustrated in FIG. 4, after transmitter signal transitions from to high, charge is fed across sensor electrode 352 to input node 351 of operational amplifier 356. This charge is stored in feedback capacitor 358, with a resulting increase in voltage at input node 351 that is dependent on the amount of charge pushed across sensor electrode 352 and also on the capacitance of feedback capacitor 358. Because the voltage at non-inverting input of operational amplifier 356 increases, the difference between the voltages at the inputs of operational amplifier 356 decrease and thus the output, reflected as Vout in the graph 400, decreases. At some point, that output voltage drops below Vrefhi, the high reference voltage, which triggers the high voltage comparator, reflected as "H" in the graph 400, to be brought high. This high voltage comparator causes the charge modifying unit 372 (whose activity is indicated with the graph labeled "Δq") to remove charge from input node 351. Voltage at V− decreases somewhat. However, after removing charge, Vout is still below Vrefhi, the high voltage comparator 362 causes coarse charge modifying unit 372 to again remove charge from input node 351. At this point, Vout rises above Vrefhi, so Vrefhi no longer causes coarse charge modifying unit 372 to remove charge from input node 351. V− decreases again and settles at the virtual ground (indicated with the dotted horizontal line), indicating that the operational amplifier 356 is operating linearly.

The coarse processing unit 370 records that charge has been subtracted twice from the input node 351 in a half period and thus records a charge modification count of +2. Coarse processing unit 370 treats this value as a digital value and performs digital processing on this value to obtain a coarse logic output. Fine signal processing unit 365 processes the voltage Vout that results from subtracting the charge from input node 351 as a fine value. Thus, fine signal processing unit 365 performs demodulation and filtering on this signal to obtain a fine logic output. The coarse processing unit 370 adds the fine logic output to the coarse logic output to obtain the final output value.

After the first half-cycle, the transmitter signal transitions from high to low and the process described above repeats, but with opposite polarity. More specifically, Vout transitions to a high value. When low voltage comparator 364 detects that Vout is above the low reference voltage Vreflo, charge modifying unit 372 adds charge to input node 351, causing the voltage at input node 351 to increase. Charge modifying 372 unit adds charge one more time to input node 351 at which point Vout drops below Vreflo. At this point, coarse processing unit processes (demodulates and filters) the charge modification count of −2 to generate a coarse logic output. Fine signal processing unit 385 processes (demodulates, filters, and converts to a digital value) the value at Vout when Vout is no longer above Vreflo to generate a fine logic output and provides the fine logic output to coarse processing unit 370. Coarse processing unit adds the coarse logic output to the fine logic output to generate the final output for the second half-cycle shown.

Note that before each transmitter signal transition, the reset signal (corresponding to reset switch 360) is asserted, which clears the voltage differential between inverting input and output of operational amplifier 356, bringing the voltage Vout to an intermediate value before transmitter signal transitions.

Charge Modifying Unit Implementations

As described above, charge modifying unit 372 adds or removes a certain amount of charge from input node 351. Charge modifying unit 372 may be implemented in a variety of different manners, some of which are now discussed.

One implementation of charge modifying unit 372 is a current source and sink that can be operated for a fixed amount of time. The current source and sink draws or provides a fixed current. By operating the current source and sink for a fixed amount of time, a fixed amount of charge is provided to or drawn from input node 351.

Another implementation of charge modifying unit 372 is a switched capacitor coupled on one end to input node 511 via a switch and on the other end selectively coupled to a power supply voltage and ground voltage (the "rail voltages") via two switches. To add charge, the switch to the power supply is closed while the switch to input node 351 and switch to ground is open. After a certain period of time, the switch to the power supply is opened and the switch to input node 351 is closed. To remove charge, the switch to ground is closed while the switch to input node 351 and switch to power supply is open. After a certain period of time, the switch to ground is opened and the switch to input node 351 is closed.

A current conveyor slaved off of a capacitor coupled to a current mirror may also be used as a charge source and sink. In such an implementation, the capacitor is driven with a signal. The signal causes the capacitor to feeds current to or draw current from a current conveyor core. A current mirror mirrors the current from the current conveyor core and this current is applied to input node 351.

Charge modifying unit 372 may also be a direct charge transfer circuit. The direct charge transfer circuit is discussed in more detail with respect to FIG. 5. A buffer-based charge removal technique may also be used as the charge modifying unit 372. The buffer-based charge removal technique is discussed in more detail with respect to FIG. 6.

Figure 5:
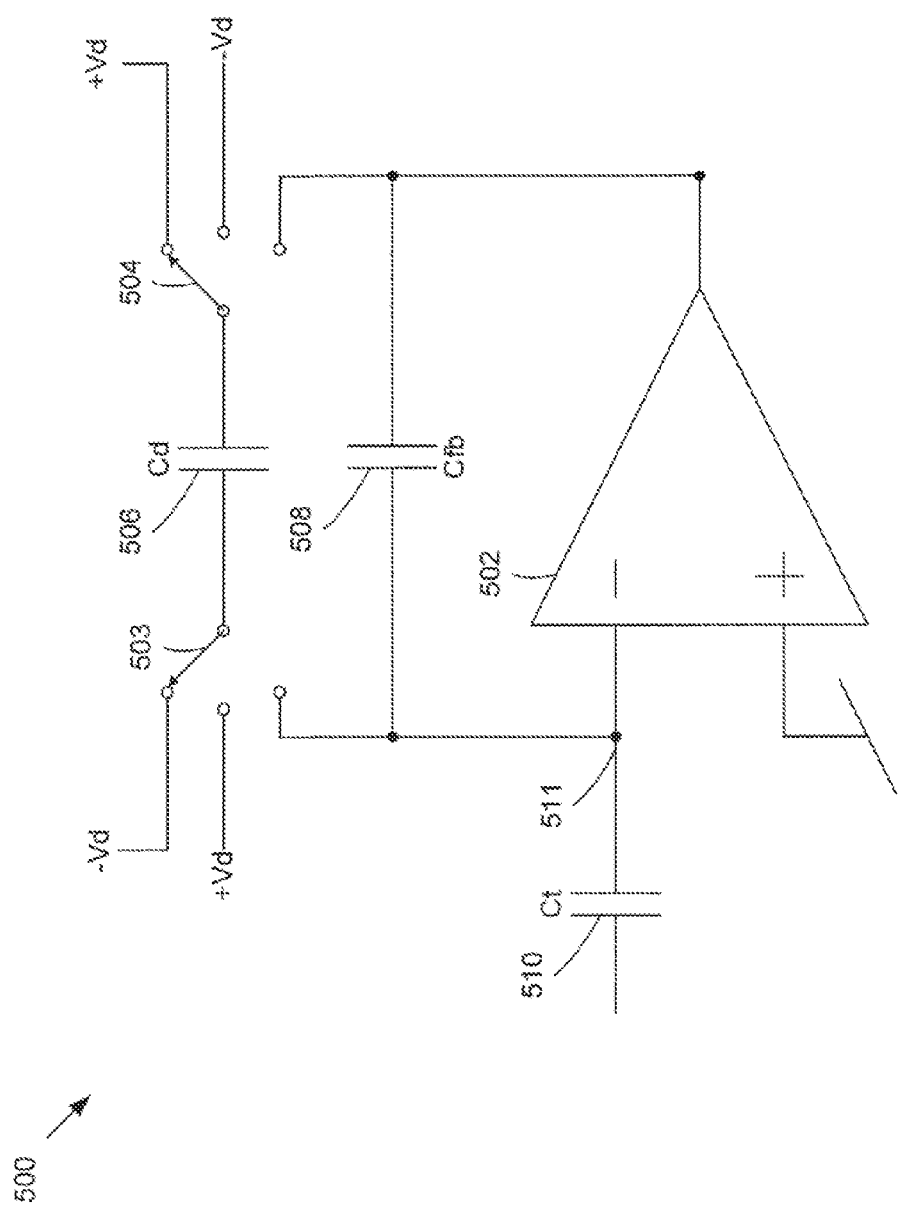
FIG. 5 is an illustration of a direct charge transfer circuit that can be used the charge modifying unit of FIG. 3B, according to an example.

FIG. 5 is an illustration of a direct charge transfer circuit 500 that can be used as the charge modifying unit 372 of FIG. 3B, according to an example. The direct charge transfer circuit 500 includes an operational amplifier 502 that corresponds to the operational amplifier 356 of FIG. 3B, a feedback capacitor 508 that corresponds to the feedback capacitor 358 of FIG. 3B, a direct charge transfer capacitor ("Cd") 506, an sensor capacitor ("Ct") 510 that corresponds to the sensor electrode 352 of FIG. 3B. For simplicity, a reset switch is not shown. It should be understood that other direct charge transfer circuits may be used in place of, or in addition to, that described in FIG. 5.

Direct charge transfer circuit 500 operates as follows. Direct transfer capacitor 506 is charged with a particular charge. To charge direct charge transfer capacitor 506, charge modifying unit 372 operates switch 503 and switch 504 such that capacitor $C_d$ 506 is coupled to +Vd and −Vd. This charges $C_d$ with charge $q_d$:

$$q_d = 2C_d \cdot V_d$$

When sensor capacitor 510 is driven with a transmitter signal, feedback capacitor 508 stores a charge $q_{fb}$. Ignoring parasitics, and assuming that the voltage at the inverting input of operational amplifier 502 is less than the voltage at the non-inverting input and that the voltage of the output of the operational amplifier 502 is near the positive power supply rail Vd (specifically, Vd−ΔV), the charge $q_{fb}$ is:

$$q_{fb} = C_{fb} \cdot (V_d - \Delta V - V_- \ldots)$$

Switch 503 is then operated to add charge from capacitor $C_d$ 506 to input node 511 by coupling $C_d$ 506 to input node 511. Charge flows from capacitor $C_d$ 506 to input node 511, increasing charge at 511. At this point, voltage on $C_{fb}$ and $C_d$ is:

$$V_{fb} = V_d = \frac{q_{fb}+q_d}{C_{fb}+C_d} = \frac{C_{fb} \cdot (V_d - \Delta V - V_-) - 2C_d V_d}{C_{fb}+C_d}$$

if Cd=γCfb where γ<1 (but not necessarily small), then:

$$V_{fb} = V_d = \frac{C_{fb} \cdot (V_d - \Delta V - V_-) - 2\gamma C_{fb} V_d}{C_{fb} + \gamma C_{fb}} = \frac{V_d - \Delta V - V_- - 2\gamma V_d}{1+\gamma}$$

The change in voltage on $C_{fb}$ is then:

$$\Delta V_{fb} = \frac{V_d - \Delta V - V_- - 2\gamma V_d}{1+\gamma} - (V_d - \Delta V - V_-) =$$

$$(V_d - \Delta V - V_-)\left(\frac{1}{1+\gamma} - 1\right) - \frac{2\gamma V_d}{1+\gamma}$$

$$= (V_d - \Delta V - V_-)\left(\frac{-\gamma}{1+\gamma}\right) - \frac{2\gamma V_d}{1+\gamma} =$$

$$\frac{-\gamma(V_d - \Delta V - V_-) - 2\gamma V_d}{1+\gamma} = \frac{-\gamma}{1+\gamma}(V_d - \Delta V - V_-)$$

$$= \frac{\gamma}{1+\gamma}(V_d - \Delta V - V_-)$$

Figure 6:
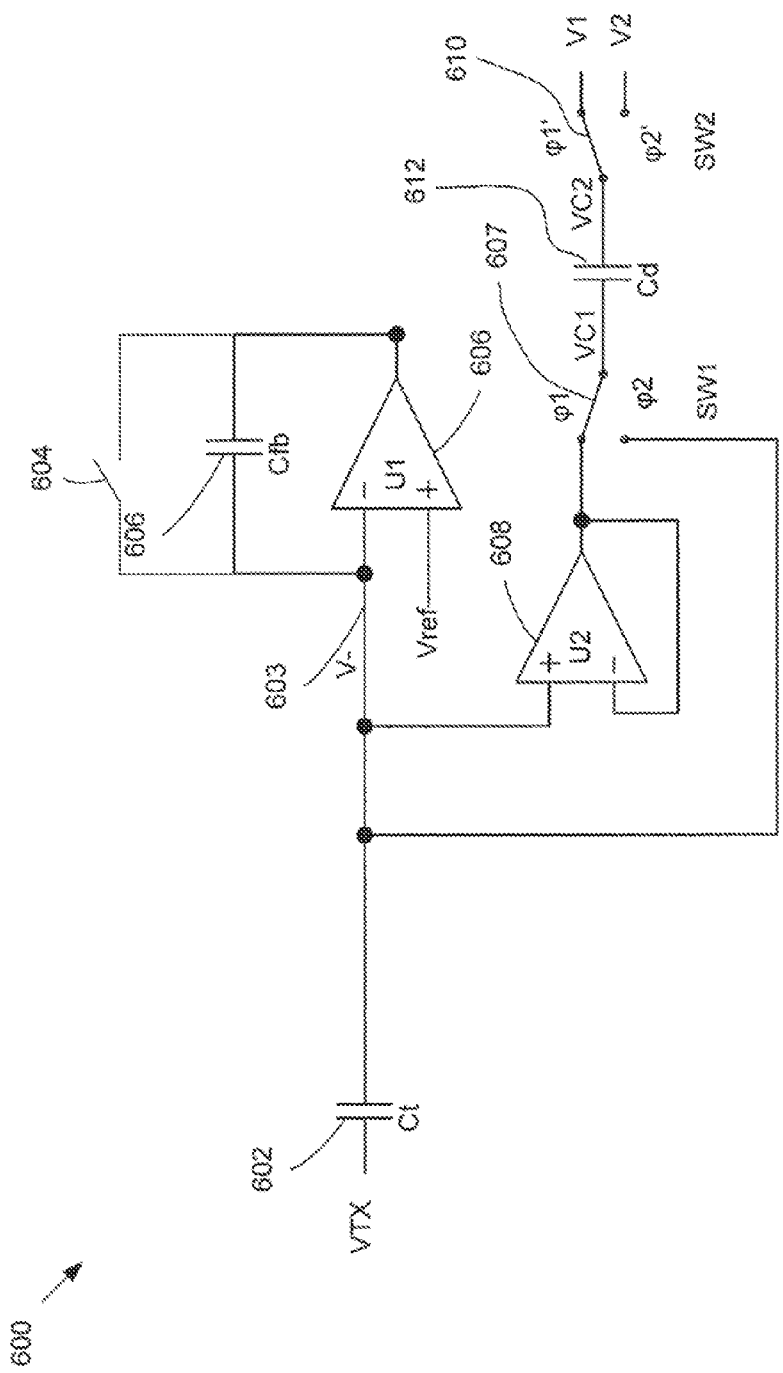
FIG. 6 is an illustration of a buffer-based charge transfer circuit that can be used as the charge modifying unit of FIG. 3B, according to an example.

FIG. 6 is an illustration of a buffer-based charge transfer circuit 600 that can be used as the charge modifying unit 372 of FIG. 3B, according to an example. The buffer-based charge transfer circuit 600 includes a buffer operational amplifier 608, a first switch 607, a second switch 610, and a charge-change capacitor $C_d$ 612.

To add or remove charge, switch 607 begins in position φ1. The output of buffer operational amplifier 608 is the same as V−. Subsequently, switch 807 is moved to position φ2 and switch 610 is moved from position φ1' to φ2'. This causes current to flow across capacitor $C_d$ 612: drawing charge from or adding charge to input node 603.

Figure 7:
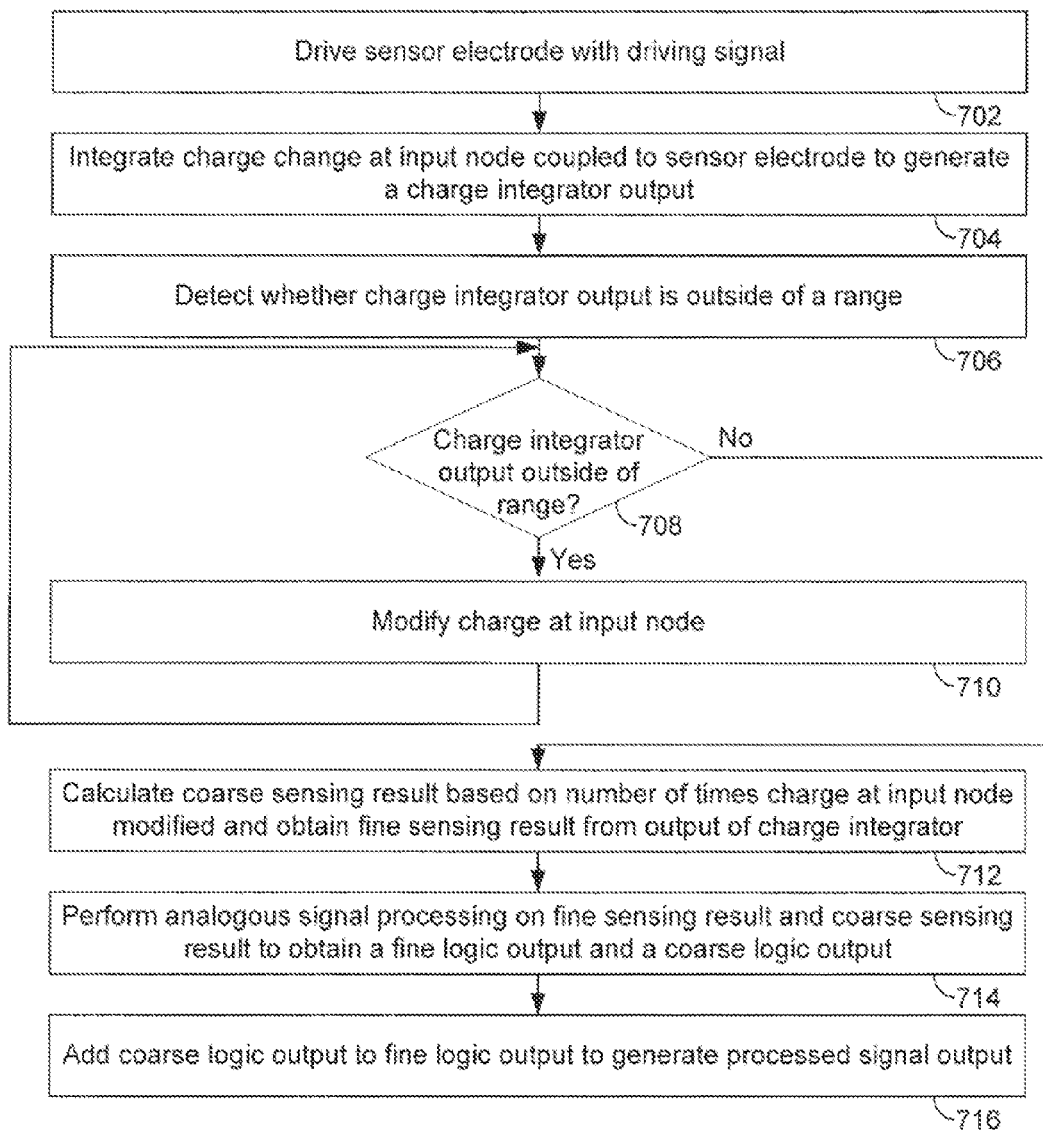
FIG. 7 is a flow chart of a method of processing a signal received from a capacitive touch sensor driven with a sensing signal, according to an example.

FIG. 7 is a flow chart of a method 700 of processing a signal received from a capacitive touch sensor driven with a sensing signal, according to an example. Although the method steps are described in conjunction with the system described with respect to FIGS. 1-6, persons skilled in the art will understand that any system configured to perform tale method steps, in various feasible alternative orders, falls within the scope of the present disclosure. Note that this method 700 is performed during a half-cycle of the transmitter signal.

As shown, the method 700 begins at step 702, where processing system 110 drives a sensor electrode 302 with a driving signal for sensing presence of an input object 140. At step 704, charge integrator 304 integrates the charge change at the input node 309 that is coupled to the sensor electrode 302. At step 706, compensation unit 308 detects whether the charge integrator output is outside of a range. At step 708, if charge integrator 304 is outside of the range, then the method proceeds to step 710, where compensation unit 308 modifies charge at input node 309. After step 710, the method 700 returns to step 708. If, at step 708, charge integrator 304 is not outside of the range, then the method 700 proceeds to step 712. At step 712, compensation unit 308 calculates a coarse sensing result based on the number of times charge at input node 309 is modified. Fine signal processing unit 306 also obtains a fine sensing result from the output of the charge integrator 304. At step 714, fine signal processing unit 306 and compensation unit 308 perform analogous signal processing on the fine sensing result and coarse sensing results to generate fine logic output and coarse logic output, respectively. The analogous signal processing may include filtering and demodulation, for example. At step 716, compensation unit 308 adds the coarse logic output and the fine logic output to generate a processed signal output.

Advantageously, processing circuitry is provided that includes a compensation unit that compensates for a reduction in dynamic range of a charge integrator by adding or subtracting charge as needed to the input node of the charge integrator. This allows the feedback capacitor of the charge integrator to be reduced in size, thus reducing the amount of area assigned to the charge integrator. By processing a "coarse" signal that is related to the number of times charge is removed or added in parallel with a fine signal, the processing circuitry produces the same results as if the feedback capacitor were not reduced in size.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed:

1. A processing system for processing a signal received from a capacitive touch sensor driven with a sensing signal, the processing system comprising:
    a charge integrator coupled to the capacitive touch sensor at a first node;
    a fine signal processing unit configured to perform signal processing on an output of the charge integrator to generate a fine logic output; and
    a compensation unit configured to:
        subtract charge from or add charge to the first node in discrete amounts of charge during a sensing half period of the sensing signal,
        perform signal processing on a coarse sensing result that is based on the charge that is added to or subtracted from the first node during the sensing half period to generate a coarse logic output, and
        add the coarse logic output to the fine logic output to generate a processed signal output.

2. The processing system of claim 1, wherein the compensation unit comprises:
    a high voltage comparator configured to compare an output of the charge integrator to a high reference voltage and to output a high voltage comparison signal;

a low voltage comparator configured to compare the output of the charge integrator to a low reference voltage and to output a low voltage comparison signal; and a charge modifying unit configured to:
subtract charge from the first node when the low voltage comparison signal indicates that the output of the charge integrator is below the low reference voltage, and
add charge from the first node when the high voltage comparison signal indicates that the output of the charge integrator is above the high reference voltage.

3. The processing system of claim 2, wherein:
the charge modifying unit comprises one of a current conveyor, a switched capacitor, a current source, and a direct charge transfer unit.

4. The processing system of claim 3, wherein:
the charge modifying unit operates independent of a voltage at an inverting input terminal of the charge integrator.

5. The processing system of claim 1, wherein the fine signal processing unit comprises:
one or more fine signal processing modules configured to process the output of the charge integrator; and
an analog-to-digital converter configured to convert an output of the one or more fine signal processing modules to the fine logic output.

6. The processing system of claim 1, wherein the fine signal processing unit comprises:
an analog-to-digital converter configured to convert the output of the charge integrator to a digital charge integrator output; and
one or more fine signal processing modules configured to process the digital charge Integrator output to generate the fine logic output.

7. The processing system of claim 1, wherein:
the coarse sensing result comprises a digital value; and
the compensation unit is configured to calculate the coarse sensing result by multiplying a number of times charge is added or removed during a sensing half period by an amount of charge added or removed each time.

8. The processing system of claim 1, wherein the compensation unit is configured to perform a self-calibration by:
at a time when the capacitive touch sensor is not driven with a sensing signal, subtract the discrete amount of charge from or add the discrete amount of charge to the first node;
receive a self-calibration value from the fine signal processing unit that is indicative of a change in output of the charge integrator that corresponds to the discrete amount of charge; and
store the self-calibration value in a self-calibration storage value unit.

9. The processing system of claim 8, wherein:
performing the signal processing on the coarse sensing result includes multiplying a number of times charge is added or removed during a sensing half period by the self-calibration value to generate the coarse sensing result.

10. A method for processing a signal received from a capacitive touch sensor driven with a sensing signal, the method comprising:
integrating charge, via a charge integrator, at a first node coupled to the capacitive touch sensor;
performing signal processing on an output of the charge integrator to generate a fine logic output;

subtracting charge from or adding charge to the first node in discrete amounts of charge during a sensing half period of the sensing signal;
performing signal processing on a coarse sensing result that is based on the charge that is added to or subtracted from the first node during the sensing half period to generate a coarse logic output; and
adding the coarse logic output to the fine logic output to generate a processed signal output.

11. The method of claim 10, further comprising:
subtracting charge from the first node when an output of the charge integrator is below a low reference voltage;
adding charge to the first node when the output of the charge integrator is above a high reference voltage; and
refraining from modifying charge at the first node when the output of the charge integrator is neither below the low reference voltage nor above the high reference voltage.

12. The method of claim 10, further comprising:
processing an output of the charge integrator, wherein the processing includes generating a digital fine logic output.

13. The method of claim 10, wherein:
the coarse sensing result comprises a digital value; and
the method further comprises calculating the coarse sensing result by multiplying a number of times charge is added or removed during a sensing half period by an amount of charge added or removed each time.

14. The method of claim 10, further comprising:
performing self-calibration by:
at a time when the capacitive touch sensor is not driven with a sensing signal, subtracting the discrete amount of charge from or adding the discrete amount of charge to the first node;
receiving a self-calibration value from a fine signal processing unit that is indicative of a change in output of the charge integrator that corresponds to the discrete amount of charge; and
storing the self-calibration value in a self-calibration storage value unit.

15. The method of claim 14, wherein:
performing the signal processing on the coarse sensing result includes multiplying a number of times charge is added or removed during a sensing half period by the self-calibration value to generate the coarse sensing result.

16. An input device comprising:
a capacitive touch sensor, and
a processing unit coupled to the capacitive touch sensor and comprising:
a charge integrator coupled to the capacitive touch sensor at a first node;
a fine signal processing unit configured to perform signal processing on an output of the charge integrator to generate a fine logic output; and
a compensation unit configured to:
subtract charge from or add charge to the first node in discrete amounts of charge during a sensing half period of a sensing signal,
perform signal processing on a coarse sensing result that is based on the charge that is added to or subtracted from the first node during the sensing half period to generate a coarse logic output, and
add the coarse logic output to the fine logic output to generate a processed signal output.

17. The input device of claim 16, wherein the compensation unit comprises:

a high voltage comparator configured to compare an output of the charge integrator to a high reference voltage and to output a high voltage comparison signal;

a low voltage comparator configured to compare the output of the charge integrator to a low reference voltage and to output a low voltage comparison signal; and a charge modifying unit configured to:
subtract charge from the first node when the low voltage comparison signal indicates that the output of the charge integrator is below the low reference voltage, and add charge from the first node when the high voltage comparison signal indicates that the output of the charge integrator is above the high reference voltage.

18. The input device of claim 17, wherein:
the charge modifying unit comprises one of a current conveyor, a switched capacitor, a current source, and a direct charge transfer unit.

19. The input device of claim 18, wherein:
the charge modifying unit operates independent of a voltage at an inverting input terminal of the charge integrator.

20. The input device of claim 16, wherein the fine signal processing unit comprises:
one or more fine signal processing modules configured to process the output of the charge integrator, and an analog-to-digital converter configured to convert an output of the one or more fine signal processing modules to the fine logic output.

* * * * *